United States Patent
Chang et al.

(10) Patent No.: US 8,308,052 B2
(45) Date of Patent: Nov. 13, 2012

(54) THERMAL GRADIENT REFLOW FOR FORMING COLUMNAR GRAIN STRUCTURES FOR SOLDER BUMPS

(75) Inventors: Chih-Horng Chang, Taipei (TW); Yian-Liang Kuo, Toufen Township (TW); Chih-Hang Tung, Singapore (SG); Tsung-Fu Tsai, Changhua (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 12/954,121

(22) Filed: Nov. 24, 2010

(65) Prior Publication Data

US 2012/0125981 A1    May 24, 2012

(51) Int. Cl.
  B23K 31/02 (2006.01)
  H01L 21/44 (2006.01)
(52) U.S. Cl. ............... 228/180.22; 228/176; 228/179.1; 228/234.1; 438/612; 438/613
(58) Field of Classification Search .................. 228/176, 228/179.1, 180.22, 234.1; 438/612, 613
See application file for complete search history.

(56) References Cited

U.S. PATENT DOCUMENTS

| | | | | |
|---|---|---|---|---|
| 5,346,775 | A * | 9/1994 | Jin et al. | 428/614 |
| 5,931,371 | A * | 8/1999 | Pao et al. | 228/180.22 |
| 7,611,041 | B2 * | 11/2009 | Tago et al. | 228/180.22 |
| 7,672,132 | B2 | 3/2010 | Fitzgerald et al. | |
| 7,759,613 | B2 * | 7/2010 | Iketaki | 219/388 |
| 7,771,547 | B2 * | 8/2010 | Bieler et al. | 148/538 |
| 7,793,818 | B2 * | 9/2010 | Tago et al. | 228/180.22 |
| 2005/0067178 | A1 * | 3/2005 | Pearson et al. | 174/52.4 |
| 2008/0006294 | A1 * | 1/2008 | Saxena et al. | 134/2 |

OTHER PUBLICATIONS

Ochoa et al., "The Effects of Cooling Rate on Microstructure and Mechanical Behavior of Sn-3.5Ag Solder", JOM, Jun. 2003, p. 56-60.*
Lee et al., "Modeling Thermomechanical Fatigue Behavior of Sn-Ag Solder Joints," Journal of Electronic Materials, vol. 31, No. 11, (2002) (pp. 1152-1159).
Makiya et al., "Grain Oriented Microstructure Made in High Magnetic Field", Key Engineering Materials, vol. 206-213, (2002) (pp. 445-448).
Zhao et al., "The effect of high magnetic field on the growth behavior of Sn-3Ag-0.5Cu/Cu IMC layer", Scripta Materialia, vol. 54 (2006) (pp. 1077-1080).
Li et al, "Influence of a high magnetic field on columnar dendrite growth during directional solidification", Acta Materialia, vol. 55, (2007) (pp. 5333-5347). Li et al., "Effect of an axial high magnetic field on the microstructure in directionally solidified Pb-Sn eutectic alloy," Journal of Crystal Growth, vol. 310, (2008) (pp. 3584-3589).
Bieler et al., "Influence of Sn Grain Size and Orientation on the Thermomechanical Response and Reliability of Pb-free Solder Joints," IEEE Transactions on Components and Packing Technologies, vol. 31, No. 2, Jun. 2008 (pp. 370-381).

* cited by examiner

*Primary Examiner* — Devang R Patel
(74) *Attorney, Agent, or Firm* — Slater & Matsil, L.L.P.

(57) ABSTRACT

A method includes heating a package structure including a first work piece and a second work piece to melt a plurality of solder bumps between the first and the second work pieces; and after the step of heating, allowing the plurality of solder bumps to solidify. During the step of solidifying, a first side of the package structure is maintained at a first temperature higher than a melting temperature of the plurality of solder bumps by using a heating source. During the step of solidifying, a second side of the package structure is maintained at a second temperature lower than the melting temperature by using a cooling source, wherein the second side is opposite the first side.

10 Claims, 12 Drawing Sheets

THERMAL GRADIENT REFLOW FOR FORMING COLUMNAR GRAIN STRUCTURES FOR SOLDER BUMPS

BACKGROUND

Solder bumps are widely used in the bonding of integrated circuit components. To bond the integrated circuit components, solder bumps are placed between, and are electrically coupled to bond pads of, the integrated circuit components. A reflow is then performed to melt the solder bumps. The reflow may be performed by heating the integrated circuit components, for example, using a heater, to a temperature higher than the melting temperature of solder bumps. The solder bumps are then solidified by blowing cold air to the integrated circuit components, wherein the cold air may be blown from opposite directions of the integrated circuit components. The reflow of solder bumps are often used in flip-chip bonding.

Solder bumps are often subject to cracking, for example, due to thermal cycles. The cracking of solder bumps result in the performance and the reliability of integrated circuits to be degraded.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 1A through 4B are cross-sectional views of intermediate stages in the reflow of solder bumps in a bonding process, wherein temperature gradients are established during the solidification of solder bumps, and magnetic fields may also be applied;

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A novel method of performing reflow for the bonding of integrated circuit components is provided in accordance with an embodiment. The variations of the embodiment are discussed. Throughout the various views and illustrative embodiments, like reference numbers are used to designate like elements.

Figure 1A:
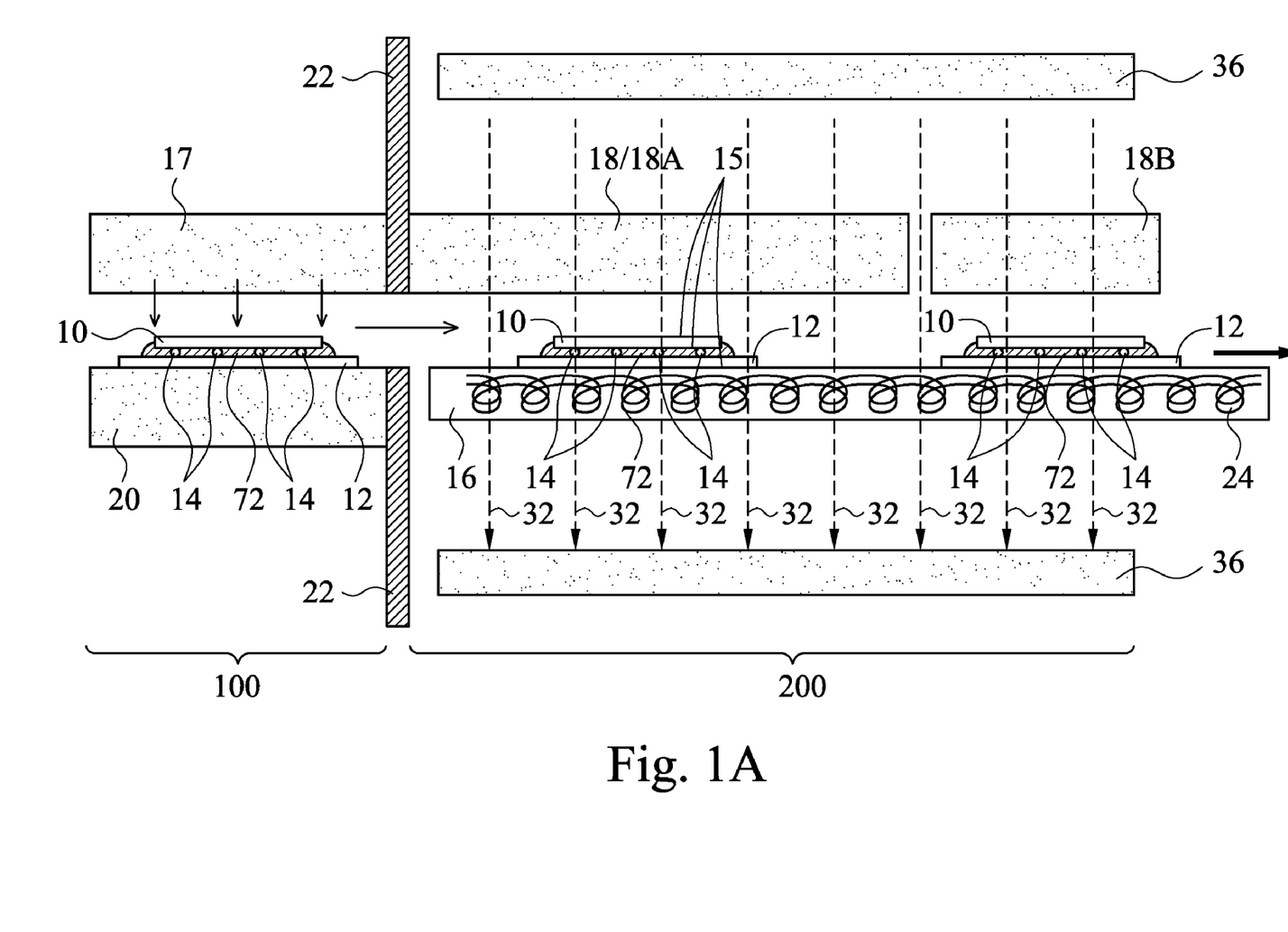
Figure 1B:
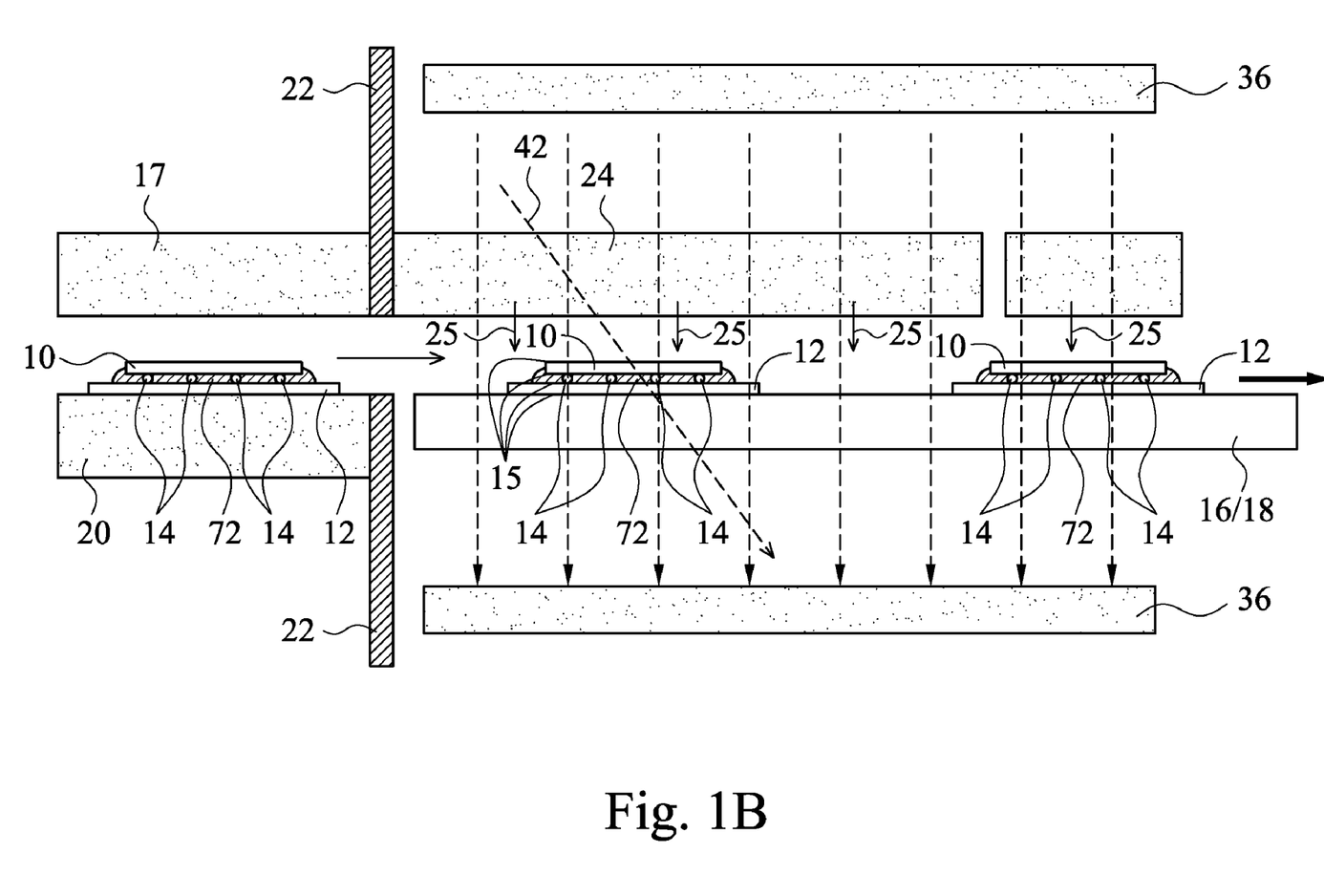

FIGS. 1A and 1B illustrate cross-sectional views of reflow processes in accordance with an embodiment. Work pieces 10 and 12 are to be bonded, for example, through flip-chip bonding. Throughout the description, work piece 10 is referred to as a device die, and work pieces 12 is referred to as a package substrate. However, in alternative embodiments, each of work pieces 10 and 12 may be a device die including integrated circuits devices such as transistors therein, a package substrate, an interposer, a printed circuit board (PCB), a C4 flip-chip package, a chip-scale package (CSP), or the like. Solder bumps 14 are disposed between work pieces 10 and 12, and are reflowed in subsequent processes. Work pieces 10 and 12 and solder bumps 14 in combination are referred to as a package structure hereinafter. In an embodiment, at the time the reflow processes are performed, underfill 72 has been dispensed between workpieces 10 and 12. In alternative embodiment, no underfill 72 was dispensed at the time the subsequently discussed reflow process is performed.

FIG. 1A illustrates a continuous reflow process, in which work pieces 10 and 12 are passed through conveyor belt 16, which is illustrated as moving from left and right. Accordingly, major surfaces 15 of work pieces 10 and 12 may be parallel to the moving direction of conveyer belt 16. In the first step of the reflow process, solder bumps 14 are heated to a temperature higher than the melting temperature of solder bumps 14. In an embodiment, the heating is performed by using one or both of heating sources 17 and 20, with heating source 17 being directly over work pieces 10 and 12, and heating source 20 being directly under work pieces 10 and 12. In an exemplary embodiment, the temperatures of work pieces 10 and 12, and the melted solder bumps 14 reach about 235° C., for example, although different temperatures may be used. In alternative embodiments, heated air (symbolized by arrows) are used to heat work pieces 10 and 12 and solder bumps 14.

After solder bumps 14 are melted, work pieces 10 and 12 are transferred from the left side to the right side of thermal and magnetic isolation wall 22, wherein thermal and magnetic isolation wall 22 is used to isolate the heat and/or the magnetic fields on the left and right sides. Throughout the description, the left side and the right side of thermal and magnetic isolation wall 22 are also referred to as chamber 100 and chamber 200, respectively. Solder bumps 14 solidify in chamber 200. In an embodiment, heating source 18 is directly over work pieces 10 and 12, and remains at a temperature higher than the melting temperature of solder bumps 14 and provides heat to work pieces 10 and 12. Cooling source 24 is directly under work pieces 10 and 12, and is at a temperature lower than the melting temperature of solder bumps 14. Throughout the description, when a heating/cooling source is referred to as being at certain temperature, it either indicates that the heating/cooling source itself is at the temperature, or the heating/cooling source blows air that is at the temperature. Cooling source 24 may be built in conveyor belt 16, as shown in FIG. 1A. Accordingly, a temperature gradient is established for each of solder bumps 14 in a top-to-bottom direction, in which the temperature is lowered gradually. Since solder bumps 14 are relatively small, to get the sufficient temperature gradient, cooling source 24 may be at a temperature equal to or lower than the room temperature (about 21° C., for example). The temperature of cooling source 24 may also be lower than about 0° C., or lower than about −20° C. The lowering in the temperature of cooling source may be performed by conducting methanol in a cooling pipe in cooling source 24. Accordingly, by contacting conveyor belt 16, work pieces 10 and 12 conduct heat to conveyor belt 16. Heating source 18, on the other hand, may be at a temperature higher than about 200°, or at about 235° C. Alternatively, heating source 18 blows hot air that to work pieces 10 and 12, with the hot air being is at the high temperature. The temperature gradient may be maintained until solder bumps 14 partially, or substantially fully, solidify. In an embodiment, inside each of solder bumps 14, the temperature gradient may be greater than about 5° C./μm, greater than about 10° C./μm, or even greater than about 20° C./μm.

With the temperature gradient established, for each of solder bumps 14, the bottom portion has the lowest temperature, and the top portion has the highest temperature. Accordingly, nucleation of solder occurs at the bottom portions of solder bumps 14 first, and dendrite growth of solder occurs starting from the nuclei at the bottom portions of solder bumps 14 upwardly. The dendrite growth results in columnar grain structures to be formed in solder bumps 14. The resulting solder grains have longer sides and shorter sides, with the longer sides extending in the temperature-gradient direction, which direction is perpendicular to major surfaces 15 of the resulting package structure. Since the direction parallel to major surfaces 15 is the most likely direction for cracks to propagate, with the columnar grains having lengthwise direction perpendicular to major surfaces 15, the possible cracking in solder bumps 14 is more likely to be blocked by solder grains, and is less likely to propagate in the direction parallel to major surfaces 15.

The dendrite growth occurs until all of solder bumps 14 solidify. During this process, work pieces 10 and 12 move to the right due to the movement of conveyor belt 16. Accordingly, in an embodiment, heating source 18 may include different portions (shown as 18A, 18B, and the like). The portions of heating source 18 on the right side may be at lower temperatures than the portions of heating source 18 on the left side, and from left to right, different portions of heating source 18 may have gradually reduced temperatures such as 235° C., 225° C., 200° C., and the like, until eventually the temperature of the portion of heating source 18 on the far right is lower than about 100° C., for example. The drop in the temperatures may be continuous or by steps. For example, portion 18A of heating source 18 may be at 235° C., while portion 18B of heating source 18 may be at 225° C. Heating source 18 may have two, three, four, or more portions having different temperatures.

In an embodiment, different portions of cooling source 24 have a substantially uniform temperature. Alternatively, the portions of cooling source 24 on the right side have higher temperatures than the portions on the left side. Accordingly, from the left side to the right side, the temperatures of different portions of cooling source 24 may gradually increase from below 0° C. to the room temperature.

Figure 2:
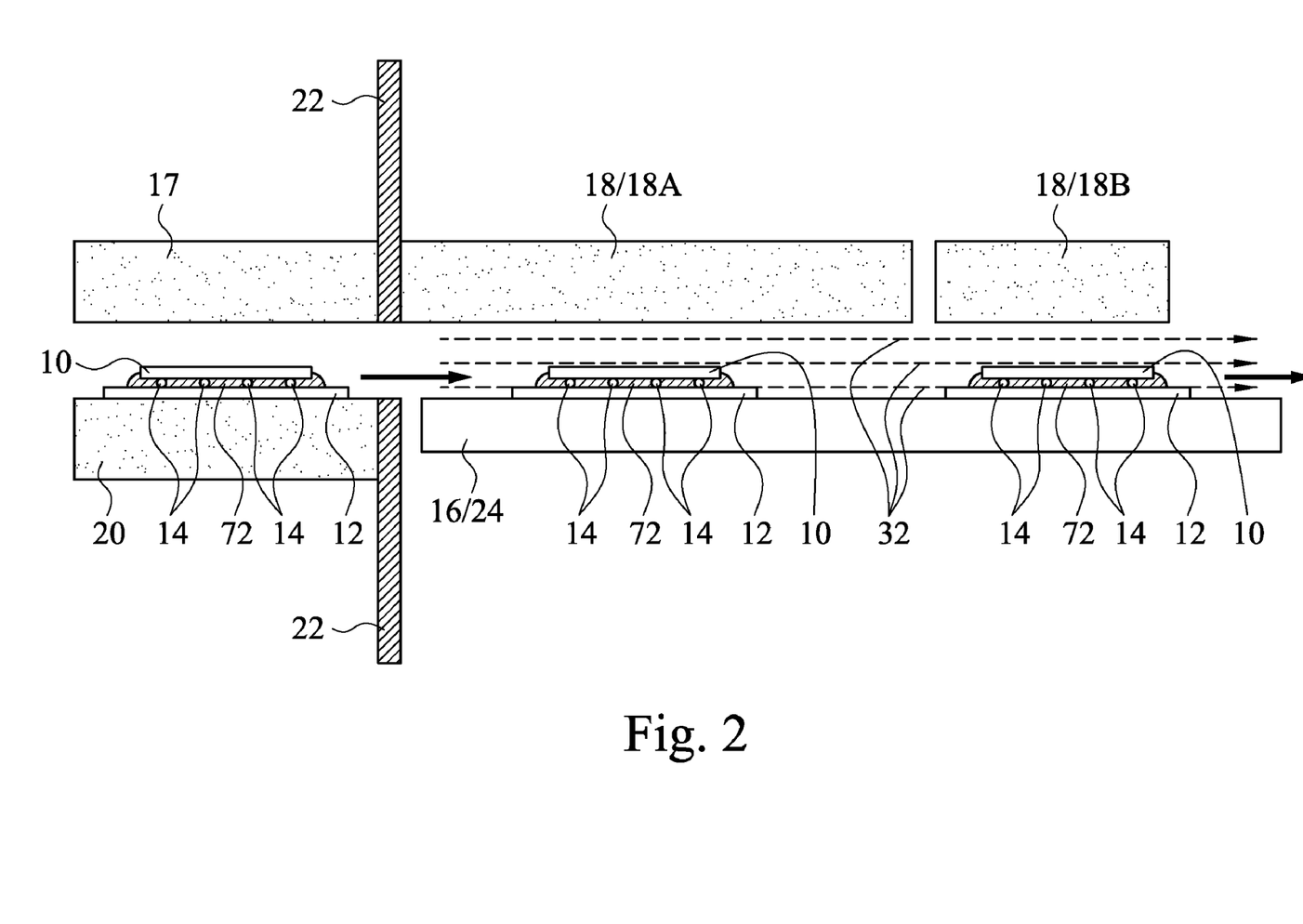

It is realized that in the grains of solder bumps, the coefficients of thermal expansion (CTEs) are different in different crystalline directions (grain directions) of solder bumps. For example, in the <001> direction of solder bumps, the CTE may be the highest among all directions. Accordingly, the <001> direction will not be aligned to the direction that is perpendicular to major surfaces 15 of work pieces 10 and 12. Otherwise, there is a higher possibility for cracking to occur. To shift the grain direction that has the greatest CTE (referred to C-axis hereinafter) away from the direction perpendicular to the major surfaces 15 of work pieces 10 and 12, during the nucleation and the dendrite growth of solder bumps 14, a magnetic field may be applied, wherein magnetic lines 32 are illustrated to represent the magnetic field. Magnetic field 32 may be generated by magnets 36 that are placed directly over and directly under conveyor belt 16. To avoid the magnetic field from affecting conveyor belt 16 and heating 18A and 18B (FIG. 1A), conveyor belt 16 and heating 18A and 18B may use carbon rods, rather than tungsten wire, as electrical resistance heating source. In an embodiment, magnetic field 32 is applied vertically, for example, in a top-to-bottom direction, as illustrated in FIG. 1A, or in a bottom-to-top direction (not shown). Magnetic field 32 may also be applied in a horizontal direction parallel to major surfaces 15, as shown in FIG. 2. In yet other embodiments, Magnetic field 32 is applied in other directions that are neither vertical nor horizontal, for example, as symbolized by arrow 43 in FIG. 1B.

For each of the embodiments shown in FIGS. 1A through 4B, the optimum direction of magnetic field 32 may be found through experiments.

With the application of magnetic field 32, the resulting C-axis, which is the axis of solder bump grains having the maximum CTE, may be adjusted, for example, away from the direction perpendicular to major surfaces 15. The C-axis may be parallel to major surfaces 15, or has an off-angle less than about 45 degrees from the planes of surfaces 15. The adjustment of the C-axis may be achieved by adjusting the direction of magnetic field 32, and/or adjusting the amplitude of magnetic field 32. In an embodiment, magnetic field 32 is higher than about 1 Tesla or higher than about 2 Tesla, and may be lower than about 9 Tesla.

FIG. 1B illustrates the cross-sectional view of a reflow process in accordance with an alternative embodiment. Unless specified otherwise, the reference numerals in the subsequently discussed embodiments represent like elements as in the embodiments illustrated in FIG. 1A, and hence the details of these elements may not be repeated. This embodiment is similar to the embodiment shown in FIG. 1A, except cooling source 24 is placed directly over work pieces 10 and 12, and may blow cold air 25 onto work pieces 10 and 12. Heating source 18 is placed directly under work pieces 10 and 12, and may include a thermal coil, for example. As a result, the temperature gradient is established in the bottom-to-top direction, and the bottom portions of solder bumps 14 have the highest temperatures, and the respective top portions of solder bumps 14 have the lowest temperatures. Accordingly, the nucleation occurs at the top portions of solder bumps 14 first, and the dendrite growth is in the top-to-bottom direction.

Figure 3A:
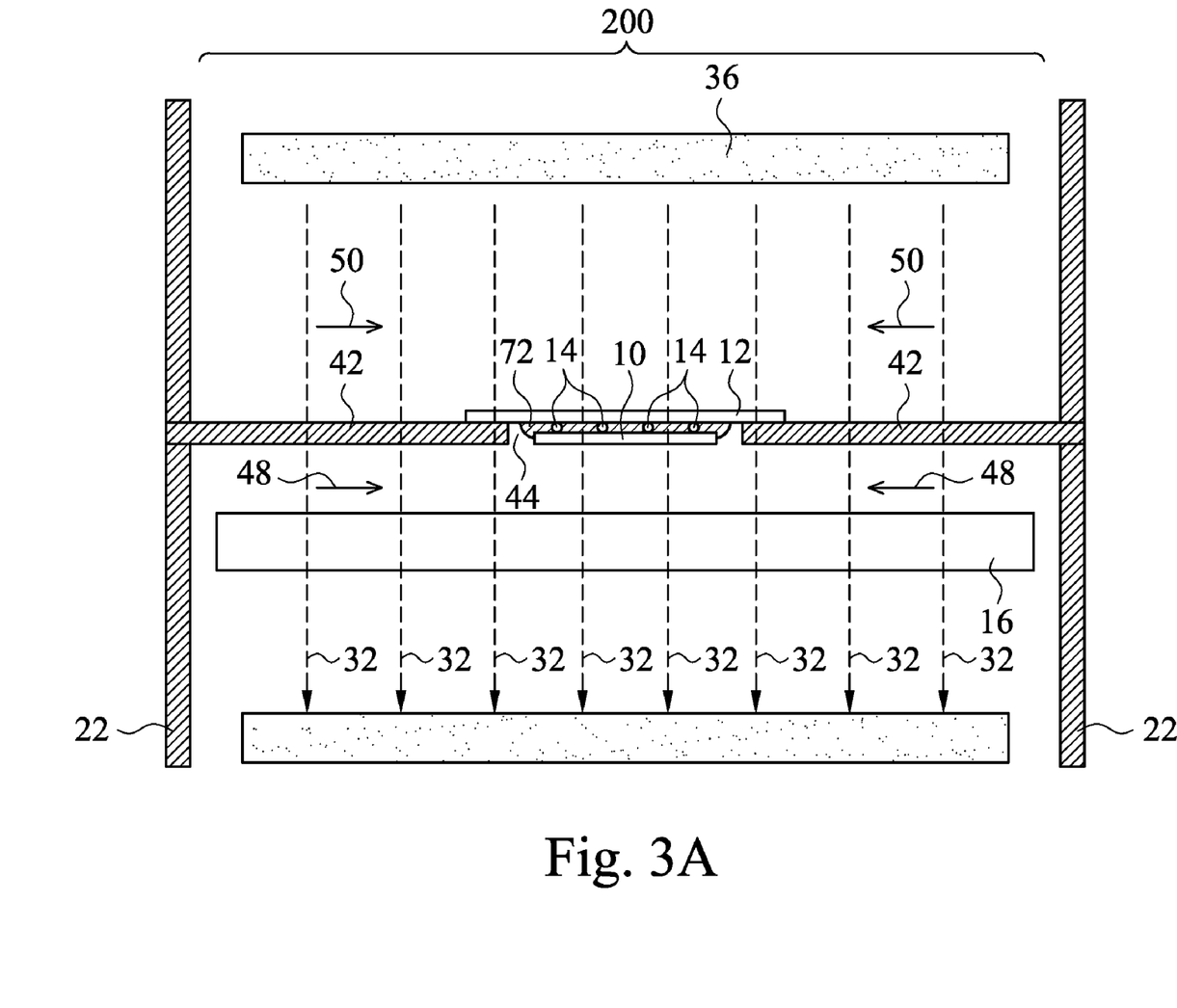

FIG. 3A illustrates a cross-sectional view of a reflow process in accordance with yet another embodiment. In this embodiment, solder bumps 14 are heated first, for example, using the settings as in chamber 100 in FIG. 1A. After the heating of solder bumps 14, work pieces 10 and 12 are transferred to chamber 200 for solidification. In alternative embodiments, both the melting and the solidification of solder bumps 14 are performed in same chamber 200. The package structure including work pieces 10 and 12 is placed in opening 44 of thermal isolation plate 42, with one side of the package structure exposed to the bottom side of thermal isolation plate 42 through opening 44. In an embodiment, thermal isolation plate 42 also acts as a support for work pieces 10 and 12, so that work pieces 10 and 12 are spaced apart from conveyor belt 16, if any. Package substrate 12 may have a greater size than die 10, and package substrate 12 may be placed on thermal isolation plate 42, while die 10 hangs under package substrate 12 through solder bumps 14. The underfill, which is fully filled into the vacancy between substrate 12 and die 10, provides the force for keeping die 10 joined to package substrate 12.

Hot air is blown onto a first side (and not to a second side) of work pieces 10 and 12, and cold air is blown onto a second side (and not to the first side) opposite the first side, wherein arrows 48 and 50 represent the hot/cold air. Each of the first and the second sides is selected from one of the top side and the bottom side. The hot air and cold air may be blown by a heating source and a cooling source (not shown), respectively. In an embodiment, hot air 50 is blown from the top side of work pieces 10 and 12, while cold air 48 is blown from the bottom side. In alternative embodiments, hot air 48 is blown from the bottom side of work pieces 10 and 12, while cold air 50 is blown from the top side. As a result, the temperature gradient may be established in a top-to-bottom direction or a bottom-to-top direction.

Magnetic field 32 may also be applied to affect the formation of the C-axis in the solidified solder bumps 14. Magnetic field 32 may be applied in the similar directions, and may have a similar magnitude, as in the embodiment shown in FIG. 1A or 2.

Figure 3B:
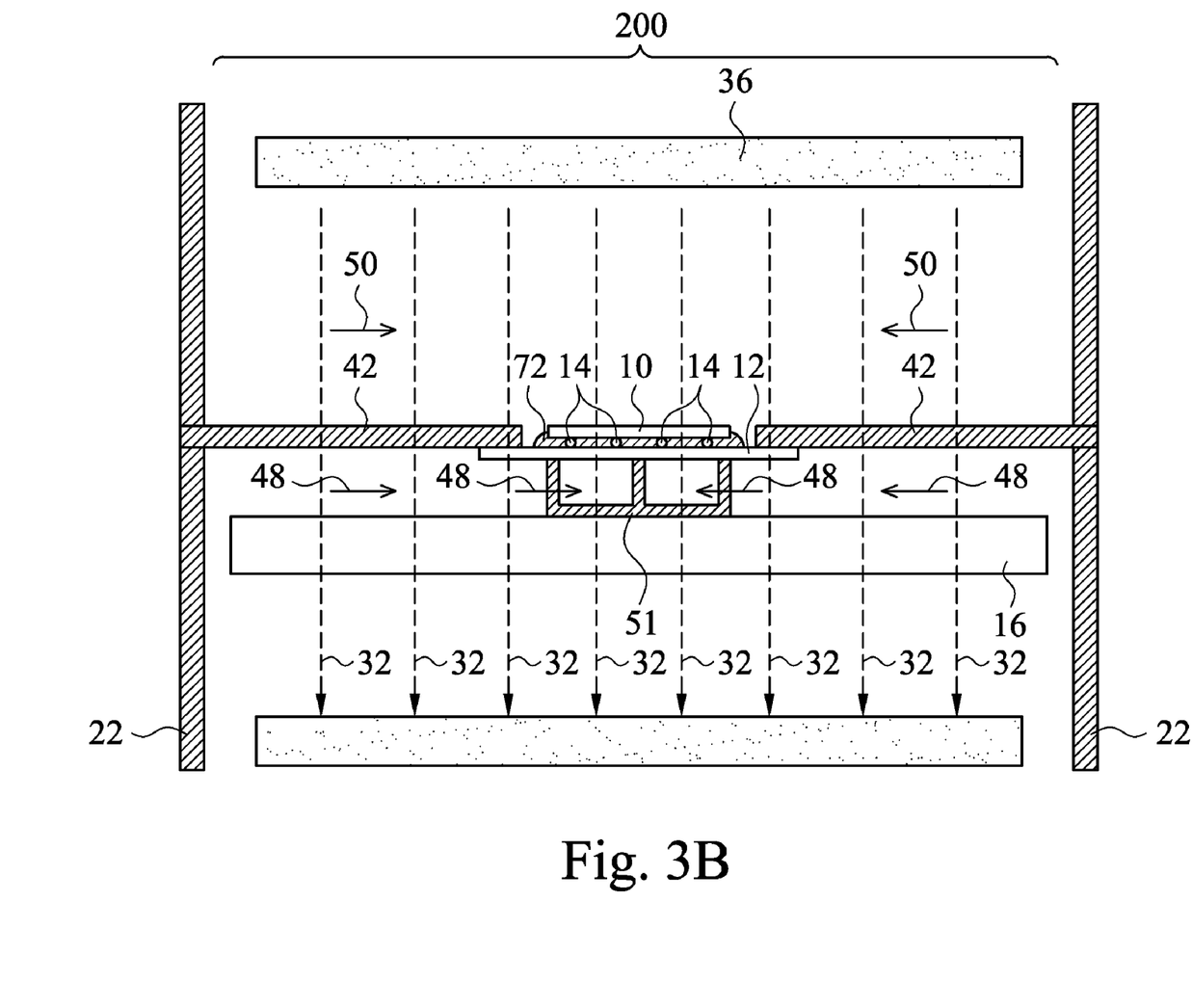

FIG. 3B illustrates an alternative embodiment, which is similar to the embodiment shown in FIG. 3A, except support 51 is placed on conveyor belt 16 to support work pieces 10 and 12. Again, thermal isolation plate 42 is disposed directly over conveyor belt 16, so that cold air is blown to one side, and hot air is blown to the other side, of work pieces 10 and 12. Again, with each of the hot air and the cold air (represented by arrows 48 and 50) blown to one side, but not to the opposite side, of work pieces 10 and 12, the temperature gradient may be established in the top-to-bottom direction or the bottom-to-top direction, depending on the directions in which the hot air and the cold air are provided. As a result, the nucleation and the dendrite growth may also occur in the bottom-to-top or top-to-bottom directions.

Figure 4A:
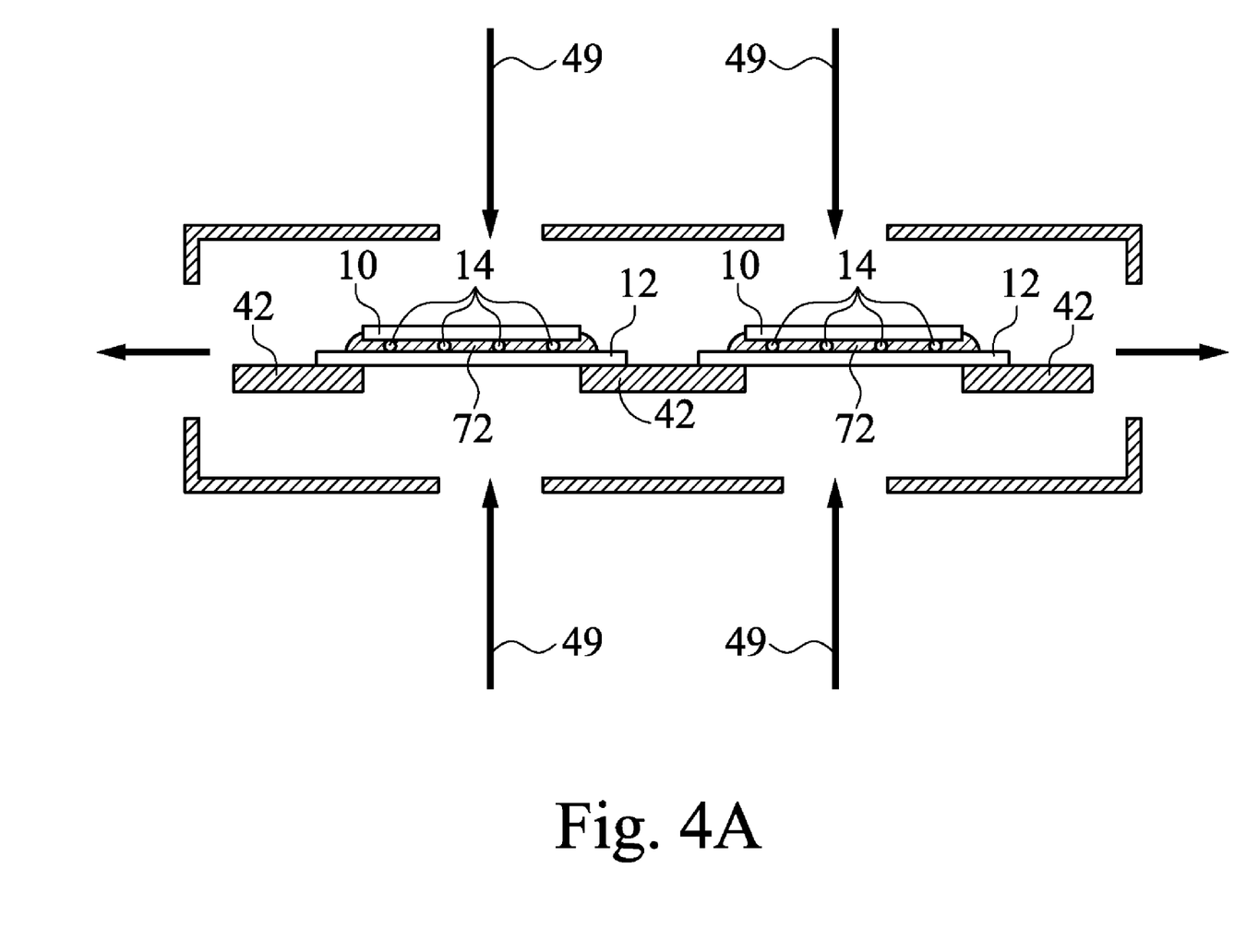
Figure 4B:
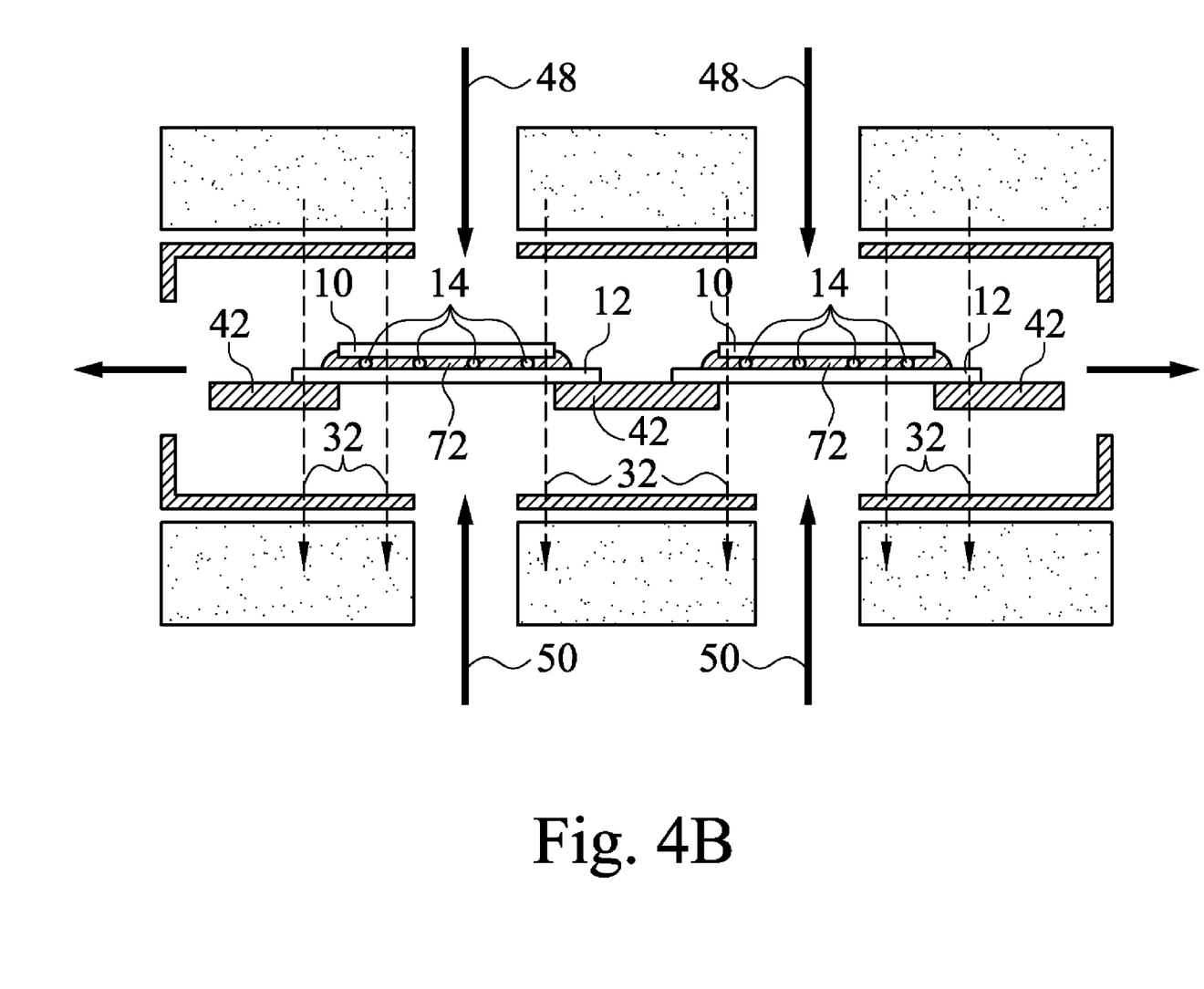

FIGS. 1A through 3B illustrate continuous reflow processes, in which work pieces 10 and 12 are transferred into and out of chamber 200 one by one. FIGS. 4A and 4B illustrate a batch reflow process, in which a plurality of pairs of work pieces 10/12 are bonded simultaneously. Referring to FIG. 4A, each of a plurality of work pieces 10 is to be bonded to one of a plurality of work pieces 12. A heating step is performed, so that solder bumps 14 are melted. In an embodiment, as shown in FIG. 4A, hot air (symbolized by arrows 49) is blown to the top side and the bottom side of each work piece pairs 10/12 to melt solder bumps 14.

Next, as shown in FIG. 4B, during the solidification of solder bumps 14, the hot air is blown to one side, and the cold air is blown to the other side, of work pieces 10 and 12, wherein arrows 48 and 50 are used to symbolize the hot air and the cold air. To ensure that each of the hot air and the cold air is blow from one side, and does not affect the other side, of the packages comprising work pieces 10 and 12, thermal insulation plate 42 is provided to thermally isolate the top side from the bottom sides of the package structures, while the package structures are placed through the openings in thermal isolation plate 42. Again, each of the hot air and cold air 48/50 may be blown from one, but not both, of the top side and the bottom side of the package structure. With such a setting, the temperature gradient may be established in solder bumps 14, and columnar grain structures may be formed in the solidified solder bumps 14. During the nucleation and the dendrite grown in solder bumps 14, magnetic field 32 may also be provided.

Figure 5:
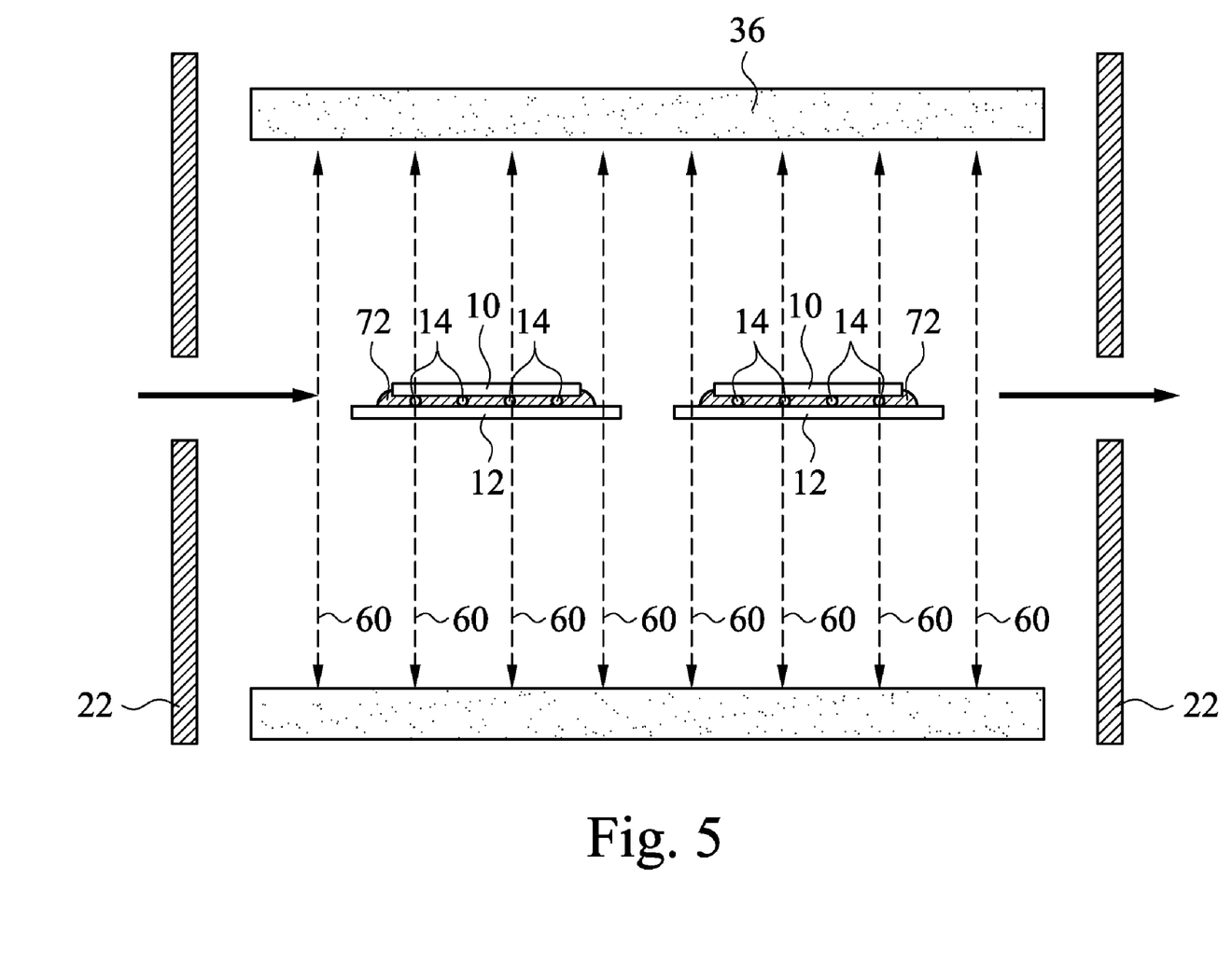
FIG. 5 illustrates the demagnetizing of integrated circuit components that are bonded by using the reflow process.

Since work pieces 10 and 12 may be magnetized as a result of magnetic field 32 (FIGS. 1A through 4B), after the reflow and the solidification of solder bumps 14, a demagnetize step may be performed, as shown in FIG. 5. The bonded work pieces 10 and 12 are placed in a fast-alternating magnetic field 60, with the direction of magnetic field 60 being inversed at a frequency, for example, about 50 MHz. The amplitude of magnetic field may be about 0.3 Tesla, and may be gradually reduced to 0 Tesla.

Figure 6A:
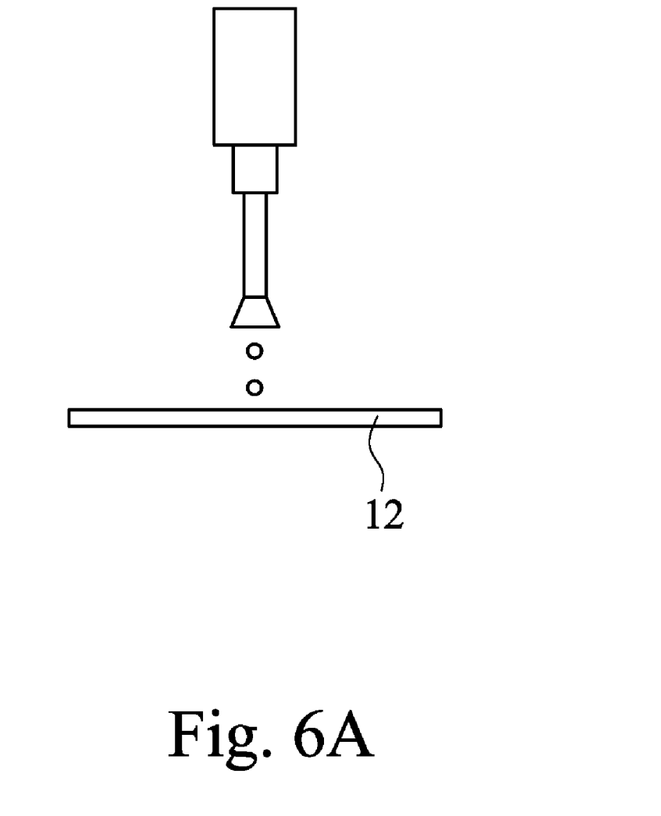
FIGS. 6A through 6G illustrates an exemplary flow of a reflow and underfill dispensing process.
Figure 6B:
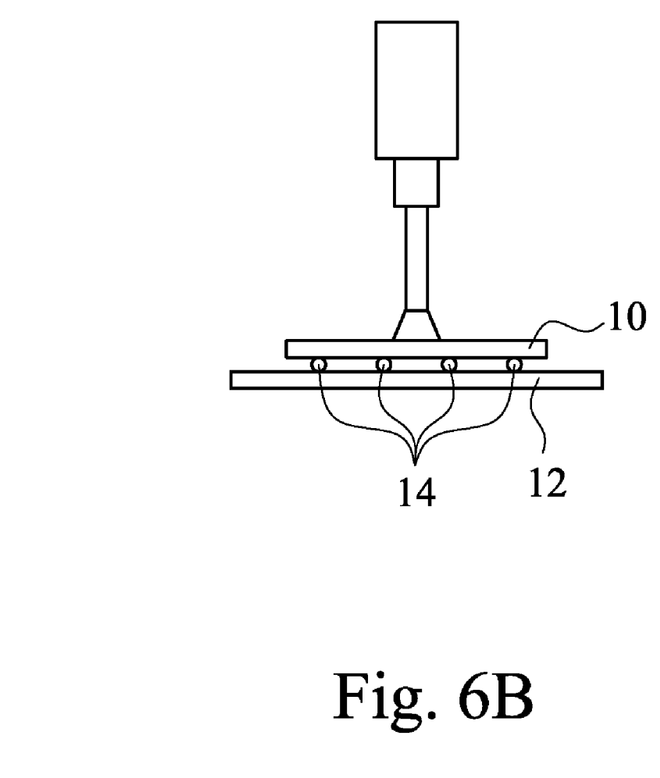

In each of the embodiments, the reflow process (FIGS. 1A through 5) may be used for joining work pieces 10 and 12, at which time no underfill has been applied yet. In alternative embodiments, the reflow processes may be performed after underfills have been applied, and a reflow has already been performed to join work pieces 10 and 12. Accordingly, the reflow processes may be performed with underfills applied thereon. FIGS. 6A through 6G illustrate an exemplary reflow and underfill dispensing process. Referring to FIG. 6A, one of the work pieces, such as workpieces 12 is dispensed with flux.

Figure 6C:
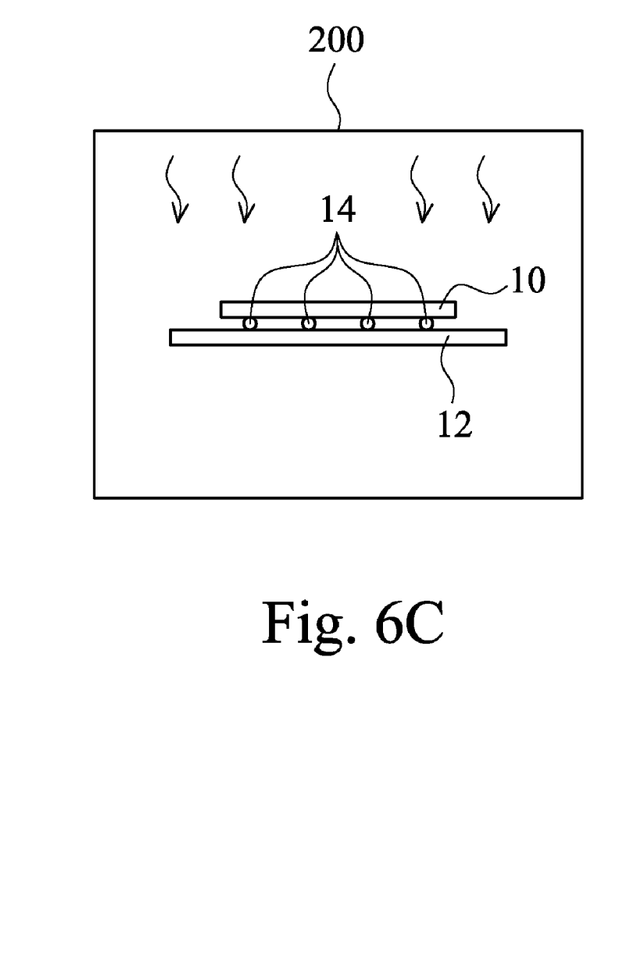
Figure 6D:
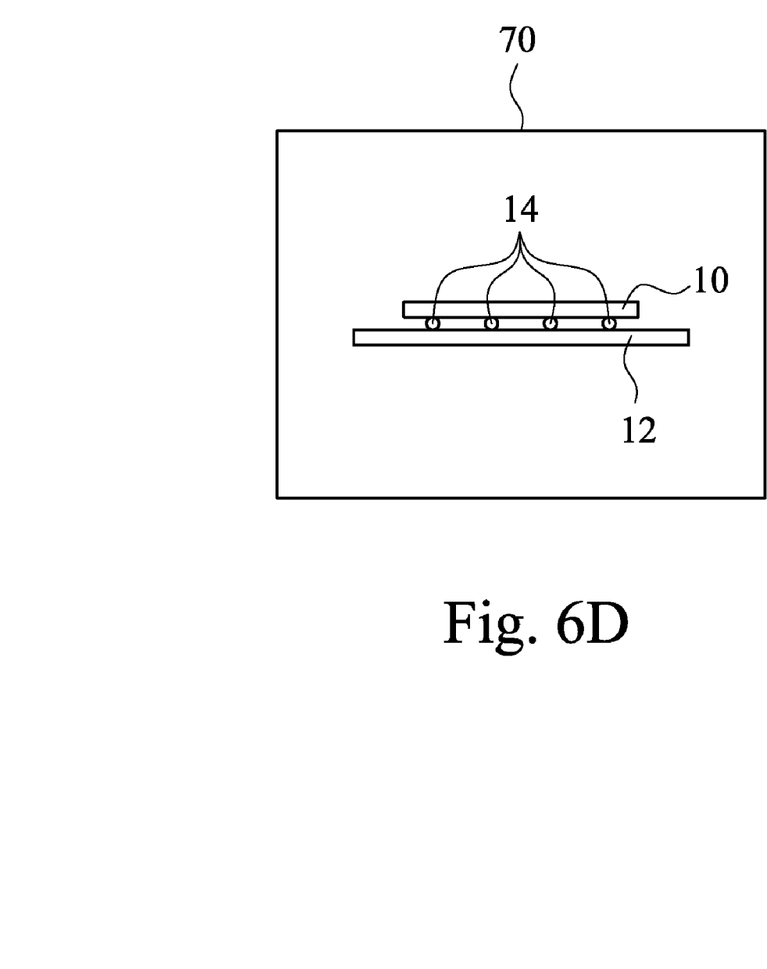
Figure 6E:
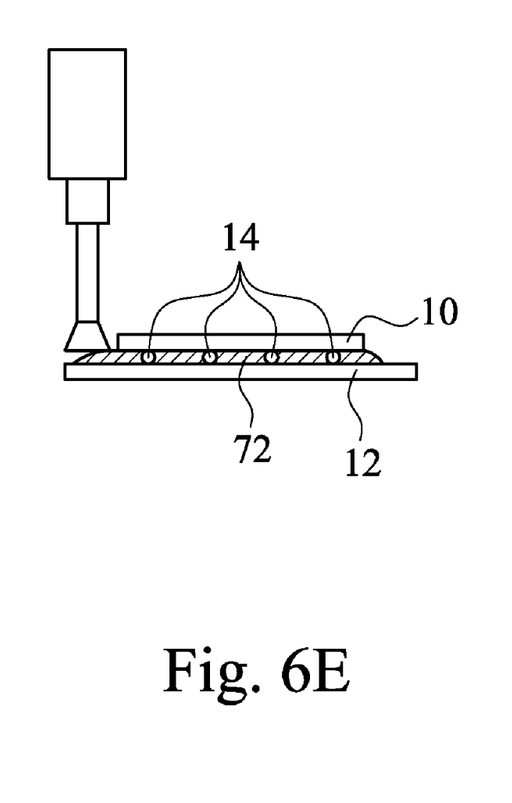
Figure 6F:
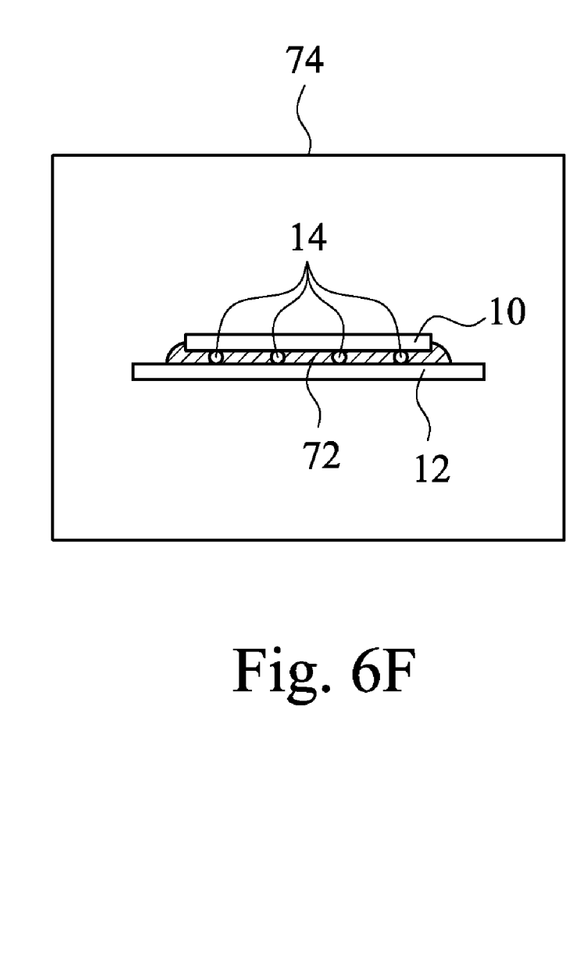
Figure 6G:
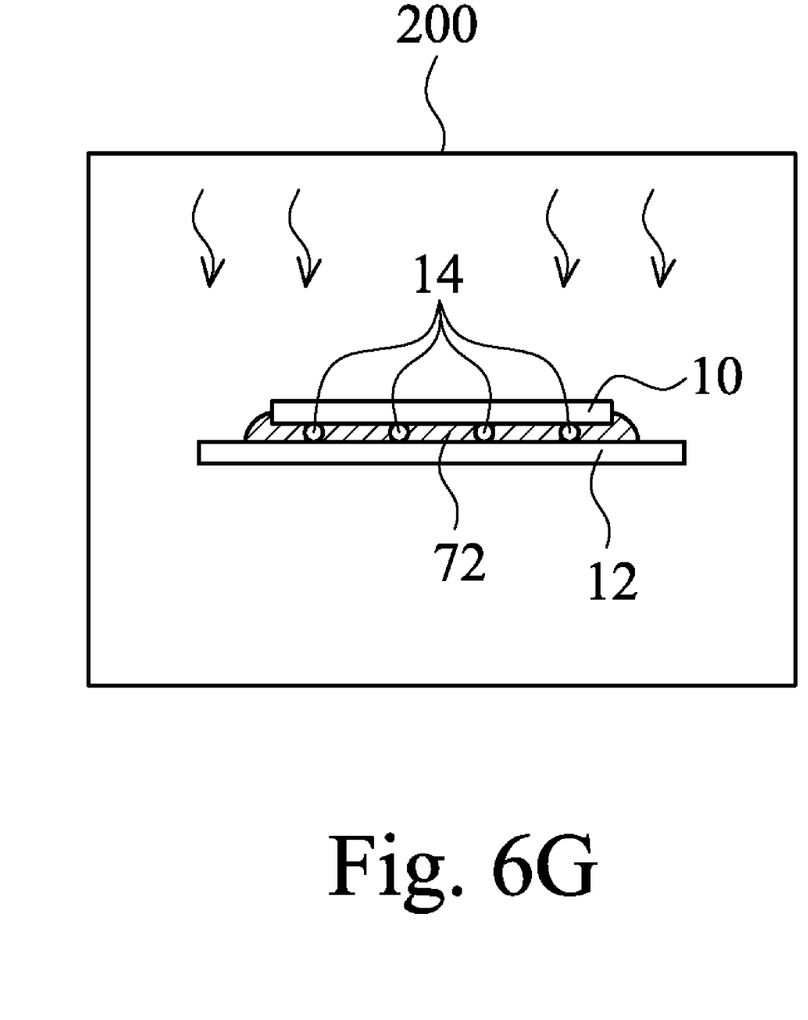

Solder bumps 14 are then placed on workpieces 12, followed by the placement of workpiece 10, so that the bond pads (not shown) in workpieces 10 and 12 contact solder bumps 14. Next, as shown in FIG. 6C, a reflow is performed, for example, inside chamber 200 and using the embodiments shown in FIGS. 1 through 5. FIG. 6D symbolizes the cleaning of flux from the resulting package structure in chamber 70. In FIG. 6E, underfill 72 is dispensed into the gap between work pieces 10 and 12 to protect the package structure from the stresses caused by the mismatch in the coefficient of thermal expansion between different materials in the package structure. FIG. 6F illustrates the curing of underfill 72, wherein the curing may be a thermal curing in chamber 74. In FIG. 6G, a secondary reflow is performed to reflow the already reflowed solder bumps 14, which are protected by under fill 72.

In embodiments, the reflow process shown in FIGS. 1 through 5 may be the reflow process as shown in FIG. 6C, and/or may be the reflow process as shown in FIG. 6G. It is appreciated that a plurality of reflow processes may be performed for solder bumps during the manufacturing and/or the testing of package structures. The very last reflow process (with no additional reflow process to melt the solder bumps after the last reflow process) may adopt the reflow process of the present disclosure, so that the columnar structure in the solder bumps may remain undamaged by any additional reflow processes.

By using the embodiments, the columnar grains having longitudinal directions perpendicular to major surfaces 15 (FIG. 1A) of work pieces 10 and 12 may be formed. Accordingly, the propagation of cracks, if any, in the solder bumps in the directions parallel to major surfaces 15 may be blocked. Further, by applying a magnetic field in the nucleation stage and the dendrite grow stage of the solder bumps, the possibility of the occurrence of cracks is also reduced.

In accordance with embodiments, a method includes heating a package structure including a first work piece and a second work piece to melt a plurality of solder bumps between the first and the second work pieces; and after the step of heating, allowing the plurality of solder bumps to solidify. During the step of solidifying, a first side of the package structure is maintained at a first temperature higher than a melting temperature of the plurality of solder bumps by using a heating source. During the step of solidifying, a second side of the package structure is maintained at a second temperature lower than the melting temperature by using a cooling source, wherein the second side is opposite the first side.

In accordance with other embodiments, a method includes stacking a first work piece directly over a second work piece, with solder bumps disposed between the first and the second work pieces; and heating the first and the second work pieces to melt the solder bumps. After the step of heating and before the solder bumps solidify, the first and the second work pieces are transferred on a conveyor belt, wherein the conveyor belt is at a first temperature not higher than a room temperature. After the step of heating and before the solder bumps solidify, hot air is blown from a top side of, and onto, the first and the second work pieces. The hot air is at a second temperature higher than a melting temperature of the solder bumps.

In accordance with yet other embodiments, a method includes stacking a first work piece directly over a second work piece to form a package structure, with solder bumps disposed between the first and the second work pieces; heating the first and the second work pieces to melt the solder bumps; after the step of heating, solidifying the solder bumps; and after the step of heating and before the solder bumps fully solidify, applying a magnetic field on the solder bumps.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
    heating a package structure comprising a first work piece and a second work piece to melt a plurality of solder bumps between the first and the second work pieces; and
    after the step of heating, allowing the plurality of solder bumps to solidify, wherein the method further comprises:
        during the step of solidifying, maintaining a first side of the package structure at a first temperature higher than a melting temperature of the plurality of solder bumps, wherein the step of maintaining is performed using a heating source; and
        during the step of solidifying, maintaining a second side of the package structure at a second temperature lower than the melting temperature by using a cooling source, wherein the second side is opposite the first side; and
    isolating a top side and a bottom side of the package structure from each other using a thermal isolation plate, wherein the heating source is configured to blow hot air from a first one of the top side and the bottom side and wherein the cooling source is configured to blow cold air from a second one of the top side and the bottom side when the package structure is placed through an opening in the thermal isolation plate.

2. The method of claim 1, wherein during the step of allowing the plurality of solder bumps to solidify, a temperature gradient is established in each of the plurality of solder bumps, and wherein the temperature gradient is in a direction substantially perpendicular to major surfaces of the first and the second pieces.

3. The method of claim 1, wherein the first temperature is higher than about 200° C.

4. The method of claim 1, wherein the second temperature is lower than about 0° C.

5. The method of claim 4, wherein the second temperature is lower than about −20° C.

6. The method of claim 1, wherein the heating source is configured to blow hot air, and the cooling source is configured to blow cold air.

7. The method of claim 1, wherein the heating source is configured to blow hot air, and the cooling source is comprised in a conveyor belt configured to transfer the package structure.

8. The method of claim 1 further comprising, during the step of solidifying, applying a magnetic field to the plurality of solder bumps.

9. The method of claim 8 further comprising, after the step of solidifying, applying an alternating magnetic field to demagnetize the plurality of solder bumps and the first and the second work pieces.

10. The method of claim 8, wherein the magnetic field is higher than about 2 Tesla.

* * * * *